United States Patent [19]

Saul

[11] 3,956,706

[45] May 11, 1976

[54] MINIATURIZED MILLIMETER WAVE INSTANTANEOUS FREQUENCY DISCRIMINATOR

[75] Inventor: David L. Saul, El Cajon, Calif.

[73] Assignee: The United States of America as represented by the Secretary of the Navy, Washington, D.C.

[22] Filed: Feb. 3, 1975

[21] Appl. No.: 546,367

[52] U.S. Cl. ............................ 328/140; 307/233 R; 324/78 R; 324/95
[51] Int. Cl.² ......................................... G01R 23/04
[58] Field of Search ........... 329/116, 160, 161, 162; 324/78 R, 95; 325/445, 449, 336, 337; 328/140, 141; 307/233 R

[56] References Cited
UNITED STATES PATENTS

| | | | |
|---|---|---|---|
| 3,480,869 | 11/1969 | Hubbard | 329/116 X |
| 3,519,937 | 7/1970 | Hubbard | 329/116 X |
| 3,530,387 | 9/1970 | Bonfeld et al. | 329/116 X |
| 3,532,989 | 10/1970 | Saad | 325/449 X |

Primary Examiner—Siegfried H. Grimm
Attorney, Agent, or Firm—R. S. Sciascia; G. J. Rubens; H. Fendelman

[57] ABSTRACT

A microstrip instantaneous frequency discriminator operable at frequencies above 18GHz. A first power divider divides the input signal into equal power outputs which are used as the inputs to second and third power dividers. One of the outputs from each of the second and third power dividers is used as the input to a 180° hybrid and the other output from each of the second and third power dividers is used as the inputs to a 90° hybrid. The outputs of the 90° hybrid and the 180° hybrid are subsequently processed to provide signals suitable for a visual polar display of the instantaneous frequency and power level of the input signal.

9 Claims, 2 Drawing Figures

MINIATURIZED MILLIMETER WAVE INSTANTANEOUS FREQUENCY DISCRIMINATOR

BACKGROUND OF THE INVENTION

A discriminator, in some suitable form, is a key element of an instantaneous frequency measuring (IFM) receiver. A receiver of the IFM type has the ability to monitor continuously all frequencies within a designated frequency band, a property very useful for certain types of surveillance operations. The IFM receiver's military use has become widespread at microwave frequencies up to 18GHz. Extension of this coverage upward in frequency has been hindered to a large extent by technical limitations of available components.

A discriminator of the type used for IFM receiver applications is referred to herein as an instantaneous frequency discriminator (IFD), the function of which is to detect the presence of a signal and to output the frequency and power characteristics of that signal. The IFD is distinguished from other types of discriminators such as, for example, those used for FM signal demodulation which are used to provide an output proportional to the frequency of a demodulated signal.

The IFD responds to an input RF signal so as to communicate the frequency and power level in the form of a visual polar display. In such a display, the angle of a radial strobe has a one-to-one correspondence with a given input signal's frequency and the length of the strobe's radius vector is proportional to a given input signal's power level. Use of a single IFD to cover a very wide band of frequencies is often desirable from a practical standpoint and a capability of operating over a 3:2 band of frequencies is considered a reasonable span of coverage.

Most previous IFD's have been confined to the conventional microwave bands, i.e., mostly to frequencies below 18GHz and require the use of a separate, frequency independent 90° phase shifter. Attempts to attain higher frequency operation have in the past been plagued by a variety of problems. Some of the most serious of these problems stem from generally poor electrical characteristics of components and interconnecting circuitry at the frequencies of interest, together with fabrication difficulties arising from physically small circuits with very close tolerances. Conventional strip line techniques tend to become impractical at extremely high frequencies. Devices such as, for example, coupled-strip line phase shifters and hybrids, widely used at frequencies below 18GHz, are very difficult to fabricate because of dimensional constraints and extremely close proximity of conductors and are therefore unsuitable for discriminators which must operate at frequencies above 18GHz.

SUMMARY OF THE INVENTION

Through the use of microwave integrated circuit techniques and a novel network design, the present invention provides a unique IFD which permits operation in the millimeter portion of the electromagnetic spectrum and lends itself readily to a lightweight and physically compact design. Because of its novel design, the present invention is particularly well suited for applications above 18GHz, although there is nothing to preclude the use of this invention at lower frequencies if desired.

The present invention exploits in a novel manner the properties of four 180° microwave hybrid junctions, three of which are connected to function as in-phase power dividers, and one 90° microwave hybrid junction. This is accomplished in such a way that a combination of output signals capable of producing a polar display of the type customarily used for IFM receivers is obtained without the necessity of providing a separate, frequency independent 90° phase shifter or its equivalent at any point in the circuit. Moreover, the invention's microstrip circuit layout is characterized by inherent simplicity, compactness, and symmetry. These features permit a physically small circuit to be fabricated without short-radius microstrip bends or excessive crowding of components in any particular region of the surface of the substrate on which the device is constructed. Additionally, sufficient room is provided for mounting of such required components as diodes and resistive terminations directly on the substrate.

STATEMENT OF THE OBJECTS OF THE INVENTION

It is the primary object of the present invention to disclose a novel instantaneous frequency discriminator.

It is a further object of the present invention to disclose an instantaneous frequency discriminator suitable for use at frequencies above 18GHz.

It is a further object of the present invention to disclose a novel microstrip IFD.

It is a still further object of the present invention to disclose a novel IFD which does not require a separate, frequency independent 90° phase shifter.

Other objects, advantages and novel features of the invention will become apparent from the following detailed description of the invention when considered in conjunction with the accompanying drawings.

DESCRIPTION OF THE PREFERRED EMBODIMENT

Figure 1:
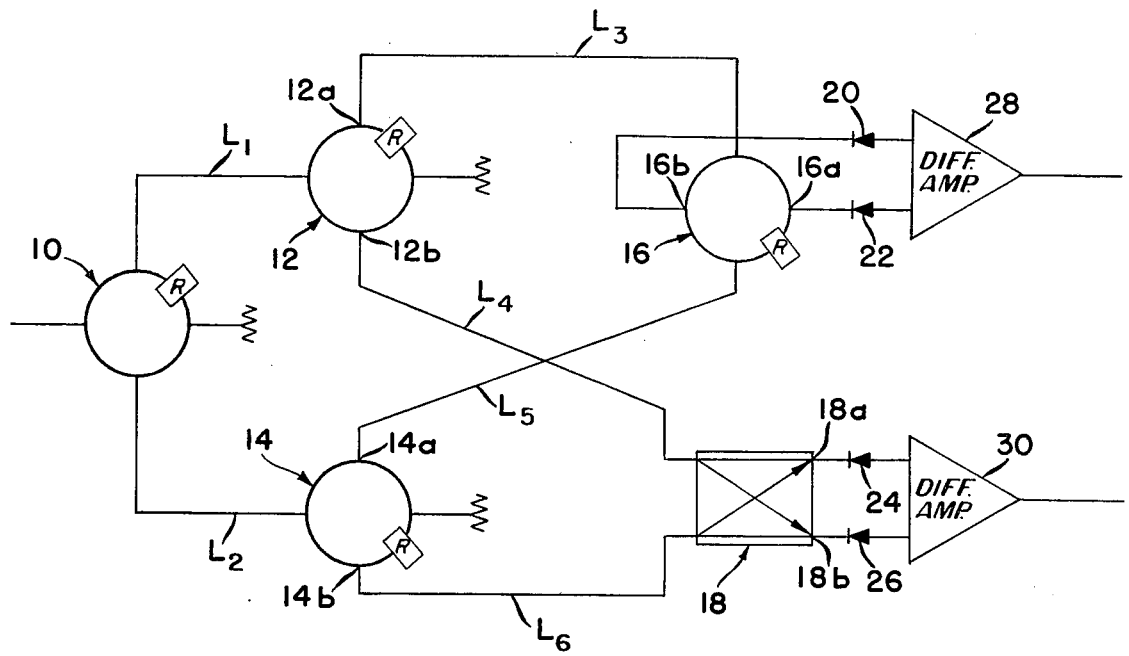
FIG. 1 is a network diagram of the IFD of the present invention.
Figure 2:
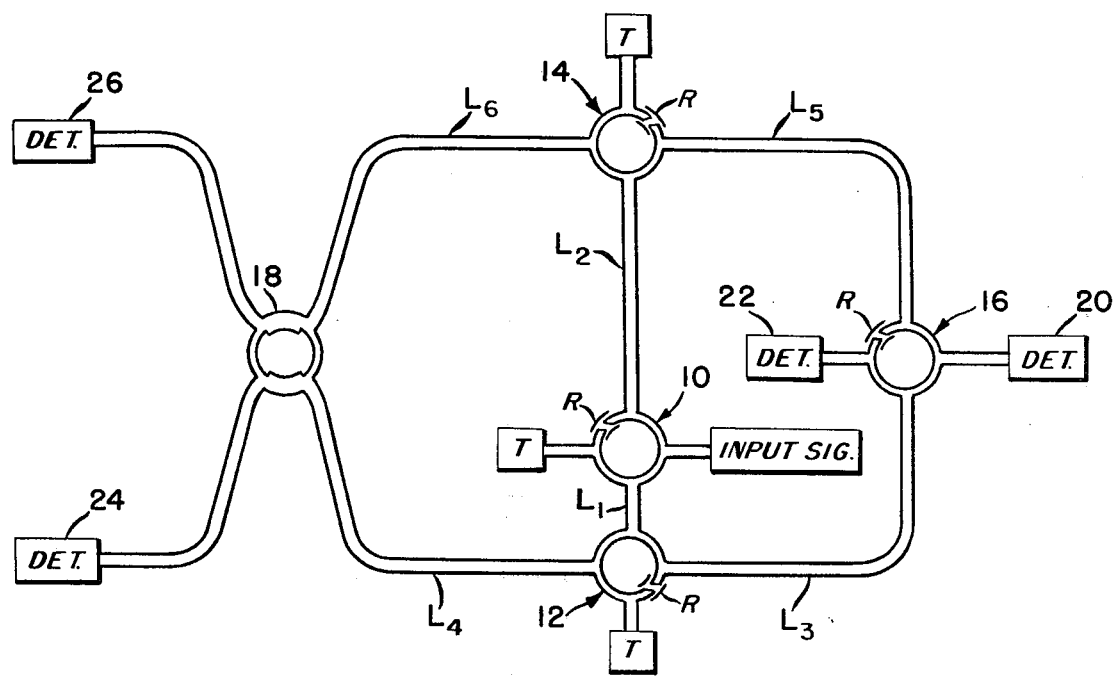
FIG. 2 is a diagram of the topology of the microstrip circuit layout of the present invention.

The present invention is implemented with microstrip components, connected as shown schematically in FIG. 1. The various circuit elements are preferably arranged according to the microstrip circuit layout shown in FIG. 2 where T's denotes termination. A substrate of copper clad irradiated polyolefin is used in the preferred embodiment of this invention. This material's low relative permittivity is advantageous from its standpoint of conductor size and fabrication tolerances, and also has a favorable loss tangent for work in the higher frequency regions.

The circuit elements 10, 12, 14, and 16 are 180° microwave hybrid junctions. In the preferred embodiment, these four hybrids are of the reverse-phase ring type, the R denoting the phase reversal, and are disclosed in detail in related U.S. patent application Ser. No. 546,369 filed on Feb. 3, 1975, in the name of John Reindel. Component 18 is a 90°, or quadrature, microwave hybrid junction and may comprise, for example, a hybrid of the branch coupler type. It is noted that the term "hybrid" is used interchangeably herein with the term "microwave hybrid junction", this usage being in accord with accepted practice among those skilled in the art.

The other components illustrated in FIG. 1 are four detectors of the square law type 20, 22, 24, and 26 illustrated in FIG. 1 by diode symbols, and two differential amplifiers 28 and 30. The circuit interconnecting lines $L_1$, $L_2$, $L_3$, $L_4$, $L_5$, $L_6$ and the output lines from hybrids 16 and 18 are fabricated of microstrip.

The operation of the device is best described mathematically. For the sake of convenience and simplicity, a convention is adopted such that phase delays along various signal paths of equal electrical lengths are omitted from the mathematical representations of signals, since these phase delays are arbitrary in nature and have no direct bearing on principles of circuit operation. The figures of merit of the detectors 20, 22, 24, and 26 are also omitted for similar reasons.

The input signal to 180° hybrid 10 may be expressed as $$V_i = E_o \cos \omega t \qquad (1)$$

in which $E_o(t)$ is an arbitrary amplitude modulating function, $\omega$ is the radian frequency of the RF input signal, and $t$ is time. Hybrid 10 is connected to function as a power divider. Lines $L_1$ and $L_2$ are of unequal electrical lengths such that $L_{20} - L_1 = \Delta L \neq 0$. The signals applied to 180° hybrids 12 and 14 following the power split of 10 and the phase delay introduced by lines $L_1$ and $L_2$ can thus be represented as $$\frac{E_o(t)}{\sqrt{2}} \cos(\omega t - \beta L_1) \qquad (2)$$

and $$\frac{E_o(t)}{\sqrt{2}} \cos(\omega t - \beta L_2) \qquad (3)$$

respectively, with $\beta$ a phase constant defined as the rate of change of phase with respect to distance along a line for fixed values of time. The value of $\beta$ is given by $$\beta = \frac{2\pi}{\lambda}$$

in which $\lambda$ is the wavelength. Hybrids 12 and 14 are also connected to function as power dividers. Lines $L_3$, $L_4$, $L_5$, and $L_6$ all have equal electrical lengths. The output of 180° hybrid 12 can thus be expressed as follows:

$$\frac{E_o(t)}{2} \cos(\omega t - \beta L_1) \qquad (4)$$

at each of its output terminals 12a and 12b. Similarly, the output of 180° hybrid 14 can be expressed as $$\frac{E_o(t)}{2} \cos(\omega t - \beta L_2) \qquad (5)$$

at its output terminals 14a and 14b.

The purpose of 180° hybrid 16 is to recombine the signals passing along lines $L_3$ and $L_5$ from the output terminals 12a and 14a. Since 16 is a 180° hybrid, the signal at output terminal 16a can be represented by $$\frac{E_o(t)}{2\sqrt{2}} [\cos(\omega t - \beta L_1) + \cos(\omega t - \beta L_2)] \qquad (6)$$

which, by trigonemetric identity, reduces to $$\frac{E_o(t)}{\sqrt{2}} \left\{ \cos[\omega t - \frac{1}{2}\beta(L_1 + L_2)] \right\} \cos \frac{1}{2}\beta\Delta L. \qquad (7)$$

Assuming square law detection by detector 22 the output of square law detector 22 is found to be $$\frac{E_o^2(t)}{2} \cos^2 \frac{1}{2}(\beta \Delta L). \qquad (8)$$

Similarly, the signal at output terminal 16b can be represented by $$\frac{E_o(t)}{2\sqrt{2}} [\cos(\omega t - \beta L_1) - \cos(\omega t - \beta L_2)] \qquad (9)$$

which, by trigonometric identity, reduces to $$-\frac{E_o(t)}{\sqrt{2}} \left\{ \sin[\omega t - \frac{1}{2}\beta(L_1 + L_2)] \right\} \sin \frac{1}{2}\beta\Delta L \qquad (10)$$

which after square law detection by detector 20 yields $$\frac{E_o^2(t)}{2} \sin^2 \frac{1}{2}(\beta \Delta L) \qquad (11)$$

as the signal at the output of detector 20. Taking the difference of the detected signals at the outputs of detectors 20 and 22 by means of differential amplifier 28 it is found that the output of 28 is $$\frac{E_o^2(t)}{2} \cos \beta \Delta L.$$

Since $\beta$ has an approximately linear RF frequency dependence, the output of differential amplifier 28 undergoes a cosine variation as the discriminator's input RF signal is varied in frequency while its power level is held constant. It is to be noted that the output of 28 varies as the square of modulation amplitude and hence as the power level of the input RF signal.

The signal at output terminal 12b is $$\frac{E_o(t)}{2} \cos(\omega t - \beta L_1) \qquad (12)$$

and the signal at output terminal 14b is $$\frac{E_o(t)}{2} \cos(\omega t - \beta L_2). \qquad (13)$$

90° hybrid 18 serves to recombine the signals passing along lines $L_4$ and $L_6$. The properties of 90° hybrid 18 are such that the signal at output 18a can be expressed as $$\frac{E_o(t)}{2\sqrt{2}} [\cos(\omega t - \beta L_1) + \cos(\omega t - \beta L_2 - 90°)] \qquad (14)$$

and the signal at point 18b can be expressed as $$\frac{E_o(t)}{2\sqrt{2}}[\sin(\omega t - \beta L_1) + \sin(\omega t - \beta L_2 - 90°)] \quad (15)$$

The signal at the output of square law detector 24 is, therefore, $$\frac{E_o{}^2(t)}{2}\cos^2 \frac{1}{2}(\beta \Delta L + 90°) \quad (16)$$

and the output of square law detector 26 is $$E_o{}^2(t) \sin^2 \tfrac{1}{2}(\beta \Delta L + 90°). \quad (17)$$

The difference of the signals at the outputs of square law detectors 24 and 26 is taken by differential amplifier 30 and is seen to be $$\frac{E_o{}^2(t)}{2}\sin \beta \Delta L. \quad (18)$$

It is to be noted that the outputs of differential amplifiers 28 and 30 are intended to be applied, through appropriate interconnecting circuitry, to a visual display such as, for example, a CRT, which responds to input signals represented in cartesian coordinates. A polar strobe will thus be displayed in response to an RF input signal. The instantaneous frequency of the RF input signal, and also the RF signal's power level, will be illustrated in the form of a polar strobe.

The angle $\theta$ of the polar strobe is given by $\theta = \beta \Delta L$. It is generally desirable to limit the angular variations of $\theta$ to a maximum of 360° to avoid ambiguity. For a frequency range of $\omega_1$ to $\omega_2$, this requires that $$\frac{\Delta L}{V_o} = (\omega_2 - \omega_1) = 2\pi \quad (19)$$

in which $V_o$ is the propagation velocity in the RF transmission lines.

Although the preferred construction of the present invention utilizes a microstrip line, this invention could also be fabricated using any planar or non-planar TEM-mode (or quasi-TEM mode) structure, e.g., stripline or coaxial line, subject to whatever technical or performance limitations may be applicable to hybrids or other components fabricated in such a medium. Some combination of microstrip with another form, or forms, of guided wave structure or structures could be used as could some combination of guided wave structures not employing microstrip.

Other kinds of 180° or 90° hybrids could be used, i.e., other than those of the reverse-phase ring or branch coupler type described above. For example, power splitters of the Wilkinson type could be employed to serve as circuit elements 10, 12 and 14.

A wide range of substrate materials other than the preferred copper clad irradiated polyolefin could be used. For example, alumina or fused quartz with chrome-gold or other suitable metallic coatings could be employed, although greater difficulty might reasonably be expected in the fabrication of reverse-phase hybrid rings because of the physical nature of these materials. Mounting of the square law detectors can either be external or directly on the IFD substrate using diode chips in beam leaded or other suitable packages for integrated circuit use. External detector mounting can be accomplished by routing signals via suitable transitions to waveguide mounted or coaxial line mounted detectors capable of covering the IFD's frequency range.

Obviously, many modifications and variations of the present invention are possible in the light of the above teachings. It is therefore to be understood that within the scope of the appended claims the invention may be practiced otherwise than as specifically described.

What is claimed is:

1. An instantaneous frequency discriminator comprising:
   a first power divider for dividing the power from an input signal equally, having first and second outputs;
   a first electrical conductor connected to said first output of said first power divider;
   a second electrical conductor connected to said second output of said first power divider;
   a second power divider connected to said first electrical connector;
   a third power divider connected to said second electrical connector;
   an output 180° hybrid connected to said second and third power dividers;
   an output 90° hybrid connected to said second and third power dividers; and
   output means connected to said output 180° hybrid and to said output 90° hybrid for outputting signals indicative of the instantaneous frequency of said input signal.

2. The discriminator of claim 1 wherein said output means comprises:
   first and second square law detectors connected to said output 90° hybrid; and
   third and fourth square law detectors connected to said output 180° hybrid.

3. The discriminator of claim 2 wherein said output means comprises further:
   a first differential amplifier connected to said first and second square law detectors; and
   a second differential amplifier connected to said third and fourth square law detectors.

4. The discriminator of claim 1 wherein said first and second electrical conductors have unequal electrical lengths.

5. The discriminator of claim 4 wherein said 90° output hybrid and said 180° output hybrid are connected to said second and third power dividers by equal electrical length conductors.

6. The discriminator of claim 5 wherein said first, second, and third power dividers are 180° hybrids.

7. The discriminator of claim 6 wherein said output means comprises:
   first and second square law detectors connected to said output 90° hybrid; and
   third and fourth square law detectors connected to said output 180° hybrid.

8. The discriminator of claim 7 wherein said output means comprises further:
   a first differential amplifier connected to said first and second square law detectors; and a second differential amplifier connected to said third and fourth square law detectors.

9. The discriminator of claim 1 wherein said first, second and third power dividers are 180° hybrids, connected to function as in-phase power dividers.

* * * * *